United States Patent
Asadi et al.

(10) Patent No.: US 12,411,659 B2
(45) Date of Patent: Sep. 9, 2025

(54) CONTEXT-AWARE BIT-STREAM GENERATOR FOR DETERMINISTIC STOCHASTIC COMPUTING

(71) Applicant: University of Louisiana at Lafayette, Lafayette, LA (US)

(72) Inventors: Sina Asadi, Lafayette, LA (US); Mohammad Hassan Najafi, Lafayette, LA (US)

(73) Assignee: University of Louisiana at Lafayette, Lafayette, LA (US)

( * ) Notice: Subject to any disclaimer, the term of this patent is extended or adjusted under 35 U.S.C. 154(b) by 881 days.

(21) Appl. No.: 17/343,971

(22) Filed: Jun. 10, 2021

(65) Prior Publication Data

US 2021/0389931 A1  Dec. 16, 2021

Related U.S. Application Data

(60) Provisional application No. 63/037,257, filed on Jun. 10, 2020.

(51) Int. Cl.
*G06F 7/58* (2006.01)
*H03M 7/26* (2006.01)

(52) U.S. Cl.
CPC .............. *G06F 7/588* (2013.01); *H03M 7/26* (2013.01)

(58) Field of Classification Search
CPC ...... G06F 7/58–588; G06F 7/70; H03M 7/26; G06N 3/047; G06N 3/0475
USPC ........................................................ 708/250
See application file for complete search history.

(56) References Cited

U.S. PATENT DOCUMENTS

2017/0359082 A1* 12/2017 Riedel ................... H04B 1/16
2018/0204131 A1* 7/2018 Najafi .................... G06N 7/01
2020/0401376 A1* 12/2020 Najafi .................... G06F 7/70

OTHER PUBLICATIONS

M. H. Najafi, S. Jamali-Zavareh, D. J. Lilja, M. D. Riedel, K. Bazargan and R. Harjani, "Time-Encoded Values for Highly Efficient Stochastic Circuits," in IEEE Transactions on Very Large Scale Integration (VLSI) Systems, vol. 25, No. 5, pp. 1644-1657, May 2017, doi: 10.1109/TVLSI.2016.2645902. (Year: 2017).*

(Continued)

*Primary Examiner* — Jyoti Mehta
*Assistant Examiner* — Huy Duong
(74) *Attorney, Agent, or Firm* — Kean Miller LLP; Jessica C. Engler; Russel O. Primeaux

(57) ABSTRACT

Disclosed herein are three context-aware architectures to accelerate the three state-of-the-art deterministic methods of SC. The proposed designs employ a control unit to extract the minimum bit-width required to precisely represent each input data. The lengths of bit-streams are reduced to the minimum lengths required to precisely represent each input data. The noise-tolerance property of the designs is preserved as each bit-flip can only introduce a least significant bit error. The proposed designs achieve a considerable improvement in the processing time at a reasonable hardware cost overhead. The proposed designs make the deterministic bit-stream processing more appealing for applications that expect highly accurate computation and also for error-tolerant applications.

13 Claims, 15 Drawing Sheets

(56) References Cited

OTHER PUBLICATIONS

M. H. Najafi, D. J. Lilja and M. Riedel, "Deterministic Methods for Stochastic Computing using Low-Discrepancy Sequences," 2018 IEEE/ACM International Conference on Computer-Aided Design (ICCAD), San Diego, CA, USA, 2018, pp. 1-8, doi: 10.1145/3240765.3240797. (Year: 2018).*

D. Jenson and M. Riedel, "A deterministic approach to stochastic computation," 2016 IEEE/ACM International Conference on Computer-Aided Design (ICCAD), Austin, TX, USA, 2016, pp. 1-8, doi: 10.1145/2966986.2966988. (Year: 2016).*

S. Yu, "Run-Time Accuracy Reconfigurable Stochastic Computing for Dynamic Reliability and Power Management: Work-in-Progress," 2020 International Conference on Compilers, Architecture, and Synthesis for Embedded Systems (CASES), Shanghai, China, 2020, pp. 1-3, doi: 10.1109/CASES51649.2020.9243711. (Year: 2020).*

S. Asadi and M. H. Najafi, "Context-Aware Number Generator for Deterministic Bit-stream Computing," 2019 IEEE 30th International Conference on Application-specific Systems, Architectures and Processors (ASAP), New York, NY, USA, 2019, pp. 140-140, doi: 10.1109/ASAP.2019.00-12. (Year: 2019).*

\* cited by examiner (a)

| Input Precision | # of Ignored LSB Bits | # of OR Gates | # of XNOR Gates | | Saved Components | |
|---|---|---|---|---|---|---|
| | | CD & Ro & So | CD & So | Ro | CD & So | Ro |
| 4-bit | 0 (Exact) | 2 | 3 | 6 | 0 | |
| | 1 | 1 | 2 | 4 | 1 Flip Flop, 1 AND Gate | 2 Flip Flops, 2 AND Gates |
| 8-bit | 0 (Exact) | 6 | 7 | 14 | 0 | |
| | 1 | 5 | 6 | 12 | 1 Flip Flops, 1 AND Gates | 2 Flip Flops, 2 AND Gates |
| | 2 | 4 | 5 | 10 | 2 Flip Flops, 2 AND Gates | 4 Flip Flops, 4 AND Gates |
| | 3 | 3 | 4 | 8 | 3 Flip Flops, 3 AND Gates | 6 Flip Flops, 6 AND Gates |
| | 4 | 2 | 3 | 6 | 4 Flip Flops, 4 AND Gates | 8 Flip Flops, 8 AND Gates |
| 16-bit | 0 (Exact) | 14 | 15 | 30 | 0 | |
| | 1 | 13 | 14 | 28 | 1 Flip Flop, 1 AND Gate | 2 Flip Flops, 2 AND Gates |
| | 2 | 12 | 13 | 26 | 2 Flip Flops, 2 AND Gates | 4 Flip Flops, 4 AND Gates |
| | 3 | 11 | 12 | 24 | 3 Flip Flops, 3 AND Gates | 6 Flip Flops, 6 AND Gates |
| | 4 | 10 | 11 | 22 | 4 Flip Flops, 4 AND Gates | 8 Flip Flops, 8 AND Gates |
| | 5 | 9 | 10 | 20 | 5 Flip Flops, 5 AND Gates | 10 Flip Flops, 10 AND Gates |
| | 6 | 8 | 9 | 18 | 6 Flip Flops, 6 AND Gates | 12 Flip Flops, 12 AND Gates |

FIGURE 16

| Input Precision | Conventional Design | | Proposed Design | | |
|---|---|---|---|---|---|
| | CP (ns) | Area ($\mu m^2$) | CP (ns) | Area ($\mu m^2$) | % of Area Overhead |
| 4-bit | 0.29 | 123 | 0.29 | 158 | 27 |
| 8-bit | 0.35 | 284 | 0.35 | 358 | 25 |
| 16-bit | 0.41 | 599 | 0.41 | 744 | 24 |

FIGURE 17

| # of Inputs | Input Precision | Conventional Design # of cycles | Proposed Design Percentage of reduced cycles |
|---|---|---|---|
| 2 Inputs | 4-bit | $2^8$ | 54 |
| | 8-bit | $2^{16}$ | 55 |
| | 16-bit | $2^{32}$ | 55 |
| 3 Inputs | 4-bit | $2^{12}$ | 69 |
| | 8-bit | $2^{24}$ | 70 |
| | 16-bit | $2^{48}$ | 70 |
| 4 Inputs | 4-bit | $2^{16}$ | 79 |
| | 8-bit | $2^{32}$ | 80 |
| | 16-bit | $2^{64}$ | 80 |
| 5 Inputs | 4-bit | $2^{20}$ | 86 |
| | 8-bit | $2^{40}$ | 86 |
| | 16-bit | $2^{80}$ | 86 |

FIGURE 18

| # of Inputs | Input Precision | Conv. Design # of Cycles | # of ignored LSB bits | Proposed Design Latency Reduction | Error Rate* (%) |
|---|---|---|---|---|---|
| 2 Inputs | 4-bit | $2^8$ | 1 | 8× | 11.0 |
| | 8-bit | $2^{16}$ | 1 | 9× | 0.7 |
| | | | 2 | 35× | 2.0 |
| | | | 3 | 142× | 5.0 |
| | | | 4 | 555× | 11.0 |
| | 16-bit | $2^{32}$ | 1 | 9× | 3E-03 |
| | | | 2 | 23× | 9E-03 |
| | | | 3 | 75× | 2E-02 |
| | | | 4 | 277× | 4E-02 |
| | | | 5 | 1000× | 9E-02 |
| | | | 6 | 3333× | 0.2 |
| 3 Inputs | 4-bit | $2^{12}$ | 1 | 24× | 15.0 |
| | 8-bit | $2^{24}$ | 1 | 27× | 1.0 |
| | | | 2 | 100× | 3.0 |
| | | | 3 | 625× | 7.0 |
| | | | 4 | 3333× | 16.0 |
| | 16-bit | $2^{48}$ | 1 | 27× | 4E-03 |
| | | | 2 | 110× | 1E-02 |
| | | | 3 | 625× | 3E-02 |
| | | | 4 | 3333× | 6E-02 |
| | | | 5 | 34482× | 0.1 |
| | | | 6 | 250000× | 0.2 |

FIGURE 20

| Input Precision | Conv. Design # of cycles | Proposed Design Latency Reduction | Error Rate (%) |
|---|---|---|---|
| 4-bit | $2^8$ | 5.5× | 3 |
| | | 15× | 9 |
| 8-bit | $2^{16}$ | 5.7× | 0.2 |
| | | 19× | 0.5 |
| | | 70× | 1.13 |
| | | 264× | 2.93 |
| | | 1000× | 6 |
| 16-bit | $2^{32}$ | 5.7× | 7E-04 |
| | | 19× | 2E-03 |
| | | 70× | 5E-03 |
| | | 264× | 1E-02 |
| | | 1000× | 2E-02 |
| | | 3333× | 4E-02 |
| | | 16393× | 9E-02 |
| | | 66666× | 0.2 |
| | | 2500000× | 0.3 |

| Image Name | Conventional Design | | Proposed Design | |
|---|---|---|---|---|
| | # of Required Cycles | Total Energy (KJ) | Total Energy (KJ) | Percentage of Reduction |
| Lena | $2^{48} \times 512 \times 512$ | 23,415 | 12,399 | 53 |
| Cameraman | | | 12,355 | 53 |
| Livingroom | | | 12,460 | 53 |
| Mandrill | | | 12,358 | 53 |

CONTEXT-AWARE BIT-STREAM GENERATOR FOR DETERMINISTIC STOCHASTIC COMPUTING

CROSS REFERENCE TO RELATED APPLICATION

This application claims priority to U.S. Provisional Application No. 63/037,257 titled "CONTEXT-AWARE BIT-STREAM GENERATOR FOR DETERMINISTIC STOCHASTIC COMPUTING" filed on Jun. 10, 2020.

STATEMENT REGARDING FEDERALLY SPONSORED RESEARCH OR DEVELOPMENT

Not applicable.

REFERENCE TO A "SEQUENCE LISTING", A TABLE, OR A COMPUTER PROGRAM

Not applicable.

DESCRIPTION OF THE DRAWINGS

The drawings constitute a part of this specification and include exemplary examples of the CONTEXT-AWARE BIT-STREAM GENERATOR FOR DETERMINISTIC STOCHASTIC COMPUTING, which may take the form of multiple embodiments. It is to be understood that, in some instances, various aspects of the invention may be shown exaggerated or enlarged to facilitate an understanding of the invention. Therefore, drawings may not be to scale. For the purposes of clarity, not every component may be labeled in every drawing.

FIG. 15 provides a table of the overhead of certain embodiments of the architecture.

FIG. 16 provides a hardware cost comparison of an embodiment of the architecture as compared to the binary-to-stochastic converter (BSC) known in the art.

FIG. 17 provides a table of performance enhancements experienced with the architecture as compared to designs known in the art.

FIG. 18 provides a table of performance improvements experienced with the clock division and rotation design architectures for error tolerant applications.

FIG. 20 provides a table of performance improvements experienced with the Sobol design for error tolerant applications.

FIELD OF THE INVENTION

The disclosed invention is in the field of sensor or edge processing (such as computer vision, autonomous vehicle operation, home automation systems, healthcare and wearable devices, signal processing, voice recognition, etc.) and stochastic computing, specifically in the design of high-performance deterministic bit-stream generator.

BACKGROUND OF THE INVENTION

Stochastic computing (SC) has been used for low-cost and noise-tolerant implementation of complex arithmetic functions. SC designs consistently achieve 50 to 100 times reductions in gate count over a wide range of applications in signal, image and video processing, compared to conventional binary radix designs. For instance, multiplication as a common but complex operation used in many applications can be performed using a single standard AND gate in stochastic domain. Input data in the [0,1] interval is represented using uniformly distributed random (i.e., interleaved) or unary (i.e., first all '1's followed by all '0's or vice versa) bit-streams. The ratio of the number of ones to the length of the bit-stream determines the bit-stream value in this paradigm. For example, 10100, 01010, and 1111000000 are all stochastic bit-streams representing 0.4. While this unconventional representation of data is not compact compared to the conventional weighted binary radix, it ensures the computation against soft errors (i.e., bit flips). Multiple bit-flips in a long bit-stream produce small and uniform deviations from the nominal value.

Figure 1A:
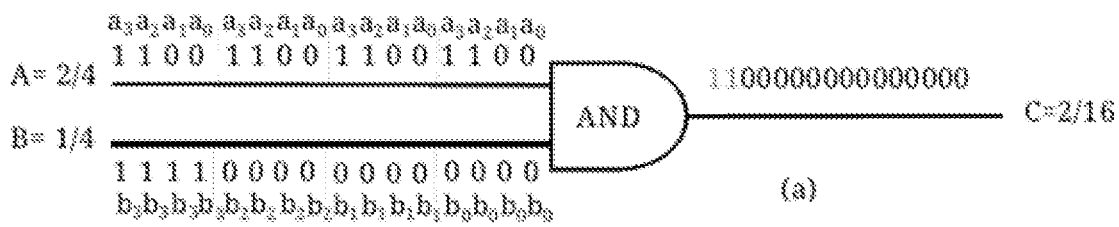
FIG. 1(a) provides an example of deterministic bit-stream-based multiplication using clock division.
Figure 1B:
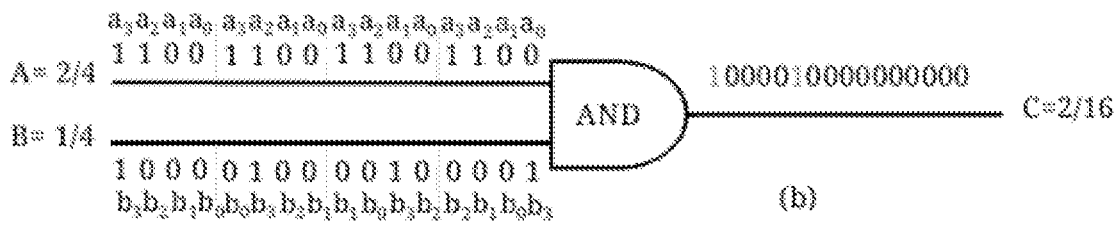
FIG. 1(b) provides an example of deterministic bit-stream-based multiplication using the rotation method.

The inaccuracy of processing bit-streams was the main issue with the conventional SC designs. Random fluctuations in generating bit-streams and correlation between bit-streams led to computations that were only correct approximately. Some deterministic methods of processing bit-streams were introduced recently to produce completely accurate results with SC circuits. Relatively prime bit-stream lengths, clock dividing bit-streams, and rotation of bit-streams are the three recently proposed methods that guarantee deterministic and accurate processing of bit-streams. These methods were initially proposed based on unary bit-streams. See Devon Jenson and Marc Riedel, "A Deterministic Approach to Stochastic Computation", *In Proceedings of the 35th International Conference on Computer Aided Design* (ICCAD '16), New York, New York, USA, Article 102, 8 pages (2016). FIG. 1 exemplifies the clock division- and the rotation-based multiplication of two input data represented using unary bit-streams. Najafi and Lilja enhanced the performance of the three deterministic methods by replacing unary bit-streams with pseudo-random bit-streams. M. H. Najafi and D. Lilja, "High Quality Down-Sampling for Deterministic Approaches to Stochastic Computing", *IEEE Transactions on Emerging Topics in Computing* (2018). More recently, deterministic methods based on low-discrepancy (LD) bit-streams have also been discussed. See A. Alaghi and J. P. Hayes, "Fast and accurate computation using stochastic circuits", in Design, *Automation and Test in Europe Conference and Exhibition* 2014. 1-4 (2014); S. Liu and J. Han, "Toward Energy-Efficient Stochastic Circuits Using Parallel Sobol Sequences", *IEEE Transactions on Very Large Scale Integration (VLSI) Systems* 26, 7 (July 2018), 1326-1339 (2018); M. Hassan Najafi, David J. Lilj a, and Marc Riedel, "Deterministic Methods for Stochastic Computing Using Low-discrepancy Sequences", in *Proceedings of the International Conference on Computer-Aided Design* (ICCAD '18). ACM, New York, New York, USA, Article 51, 8 pages (2018). Data is converted from conventional binary to Sobol or Halton sequence-based LD bit-streams and processed using stochastic logic. The result produced by all these deterministic methods are completely accurate, the same as the results from conventional binary designs.

A common property to all these deterministic methods of SC is that, for operations such as multiplication that require independent input bit-streams [9], producing exact (i.e., completely accurate) results requires generating and processing bit-streams for $2^{m \times n}$ clock cycles, where m is the number of inputs and n is the precision of input data. For example, processing two 8-bit precision numbers requires generating $2^6$-bit bit-streams in $2^{16}$ cycles. Obviously, the processing time increases exponentially by increasing the number of inputs and the precision of data. This latency soon becomes unacceptable for any application. Long latency further translates to high energy consumption (energy=power×time). The long latency and the high energy consumption make the current deterministic bit-stream processing designs inefficient for applications that expect high accuracy.

The first and most costly step in processing data using deterministic bit-stream processing systems is to convert the data from conventional binary to bit-stream representation. The conventional bit-stream generators used in these systems generate and process bit-streams regardless of the value of the input data. Whether the input is 128/256 or 13/256, the same length bit-stream (e.g., 256-bit) is generated. 13/256 is a real number with the data-width (i.e., precision) of eight bits. It thus requires a bit-stream of at least 256 bits to be precisely represented. However, 128/256 (=½) is a real number with the data-width of one bit. It can therefore be represented precisely using a short bit-stream of only 2 bits (i.e., 10 or 01).

Figure 2:
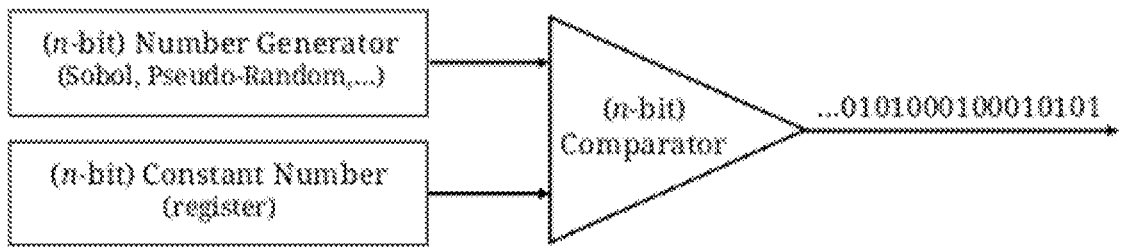
FIG. 2 provides a diagram of the conventional structure of a binary-to-stochastic converter presently used in the art for deterministic methods of processing bit-streams.

To process data with the deterministic bit-stream processing systems, the data must first be converted from the conventional binary to a bit-stream representation. FIG. 2 shows the conventional structure of a binary-to-stochastic converter (a.k.a. stochastic number generator (SNG) or converter module) currently used in the deterministic methods of processing bit-streams. An increasing/decreasing number from an up/down counter (for the clock division and rotation methods) or a Sobol number (for the LD method) is compared to a constant number (based on the target input data), and the output of comparison produces one bit of the bit-stream in each cycle. A one is generated at the output of the comparator if "Number Source"<"Constant Number". A zero is generated otherwise.

Figure 3:
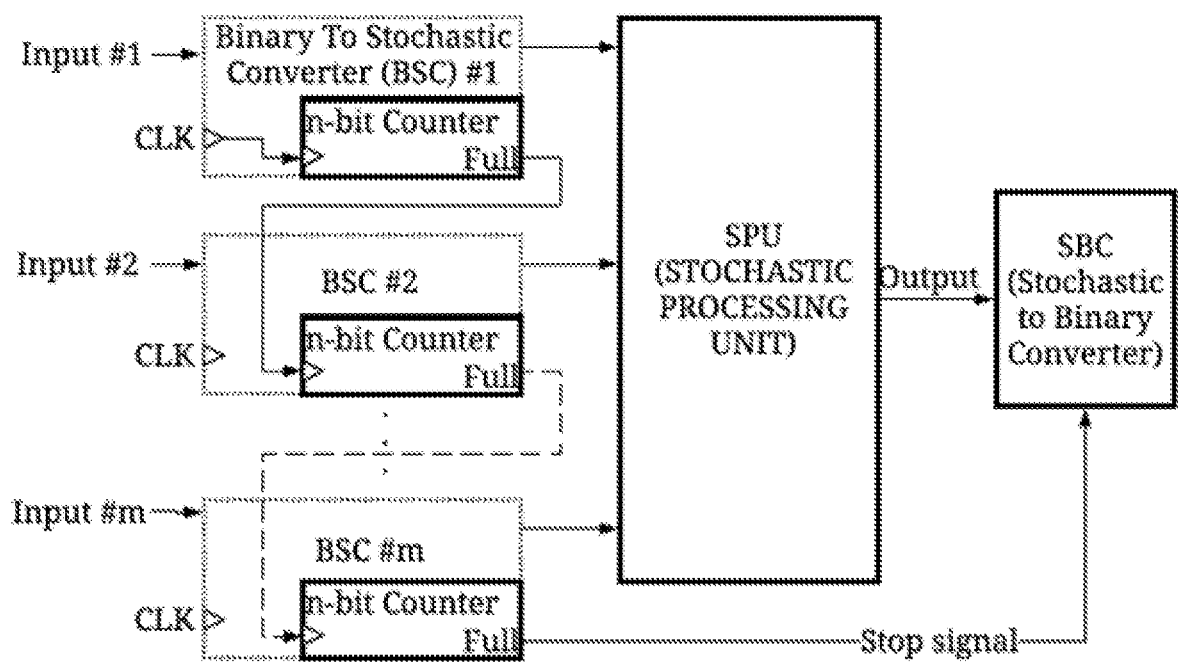
FIG. 3 is a diagram of the conventional architecture of a deterministic bit-stream processing system based on the "clock division" method known in the art.
Figure 4:
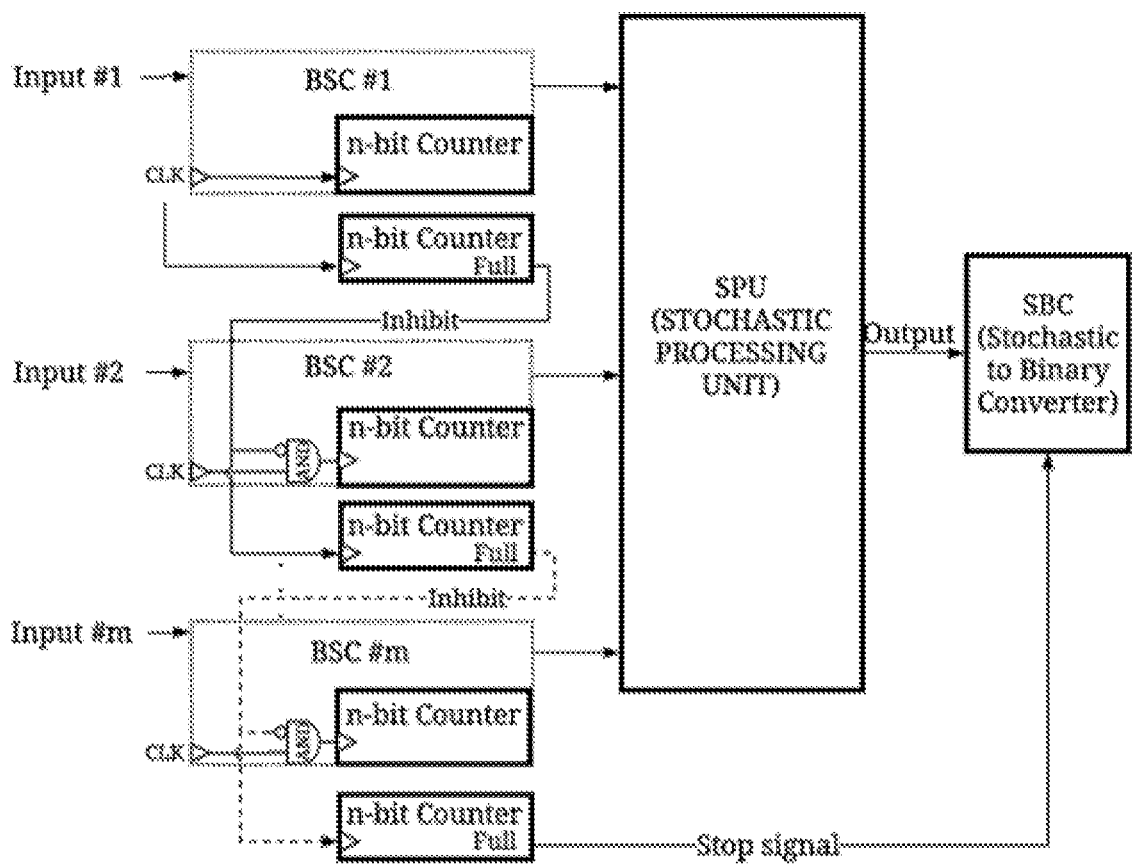
FIG. 4 is a diagram of the conventional architecture of a deterministic bit-stream processing system based on the "rotation" method known in the art.

FIGS. 3 and 4 depict the conventional architecture of the deterministic bit-stream processing systems based on the clock division and the rotation method known in the art. Input data is converted from binary to unary bit-streams using counter-based binary-to-stochastic converter (BSC) units. A stop signal determines when the result is ready and the system must stop processing. As shown in FIG. 3, in the clock division-based design, the stop signal is produced at no additional hardware cost by using the same counters used in the converter modules. The rotation-based design, on the other hand, utilizes some additional counters chaining the overflow (full) output of each converter's counter to the clock inputs of the next input counters to generate the inhibit signals. With this design structure, the n-bit counter of the ith converter module is inhibited every $2^{ni}$ cycles.

Figure 6:
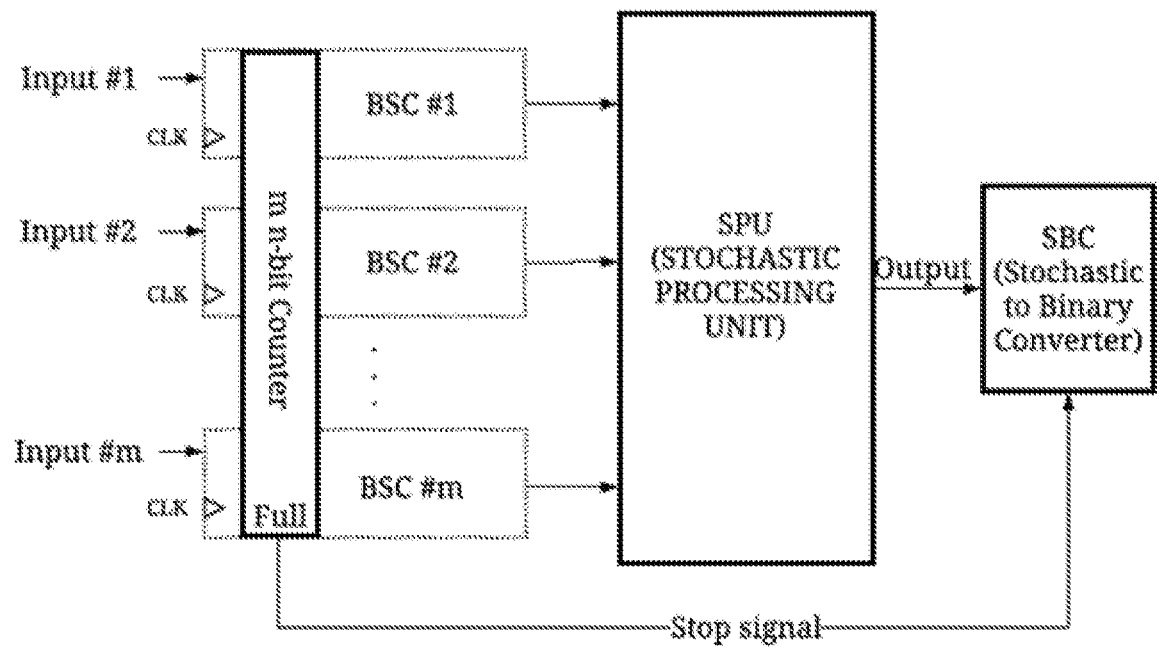
FIG. 6 is the conventional architecture of a deterministic bit-stream processing system based upon Sobol sequences.

Sobol sequences have been also used recently to generate and process bit-streams deterministically. It has been showing in the art that direct use of different Sobol sequences in converting input data to LD bit-streams can guarantee deterministic and accurate processing of bit-streams. The output converges to the expected result faster than the unary-bit-stream-based designs. The number of processing cycles to produce completely accurate results, however, is the same as the unary designs. The down-side is the high cost of generating Sobol sequences. FIG. 6 demonstrates the architecture of a deterministic bit-stream processing system based on LD Sobol bit-streams. Each BSC unit compares the input data to a Sobol number from a Sobol number generator. An m×n-bit counter is shared between all convertor modules. The full output of this counter serves as the required stop signal of the system.

In all these bit-stream processing systems, m independent inputs are converted from binary radix to bit-stream representation using m converter modules. Each system runs for $2^{m \times n}$ cycles to produce exact (completely accurate) result. The processing is stopped by sending a stop signal to the stochastic-to-binary converter (SBC) unit. The stop signal turns to "1" when the system operates for exactly $2^{m \times n}$ cycles.

SUMMARY OF THE INVENTION

Disclosed herein are three context-aware architectures to accelerate the three state-of-the-art deterministic methods of SC. The disclosed designs employ a control unit (CU) to extract the minimum bit-width required to precisely represent each input data. The lengths of bit-streams are reduced to the minimum lengths required to precisely represent each input data. The noise-tolerance property of the designs is preserved as each bit-flip can only introduce a least significant bit error. The proposed designs achieve a considerable improvement in the processing time at a reasonable hardware cost overhead. The proposed designs make the deterministic bit-stream processing more appealing for applications that expect highly accurate computation and error-tolerant applications.

Context-aware generation of bit-streams can significantly improve the processing time of the deterministic bit-stream processing systems. Herein disclosed is a CU to enhance the performance of the bit-stream generator unit. The controller determines the actual bit-width of each input data and dynamically adjusts the system to generate the bit-streams with the minimum required length. The bit-stream generators reduce the number of operation cycles up to 86% compared to the state-of-the-art bit-stream processing designs.

DETAILED DESCRIPTION OF THE INVENTION

The conventional architectures known in the art generate bit-streams regardless of the value of the input data. Multiplying 10/16 (1010 in binary radix) and 8/16 (1000 in binary radix) using the conventional architectures require the same number of cycles as multiplying 9/16 and 15/16. In both cases, the system must run for $2^{4+4}(=256)$ cycles to produce the exact result. The deterministic methods of processing bit-streams, however, can produce the exact result of multiplying 10/16 and 8/16 in only $2^{3+1}(=16)$ cycles if effectively change 10/16 to 5/8 and 8/16 to 1/2, and represent each one using its minimum required bit-stream length (i.e., 8 and 2 bits, respectively). For this set of inputs running the system for more than 16 clock cycles wastes the time and more importantly the energy resources of the system.

Figure 5:
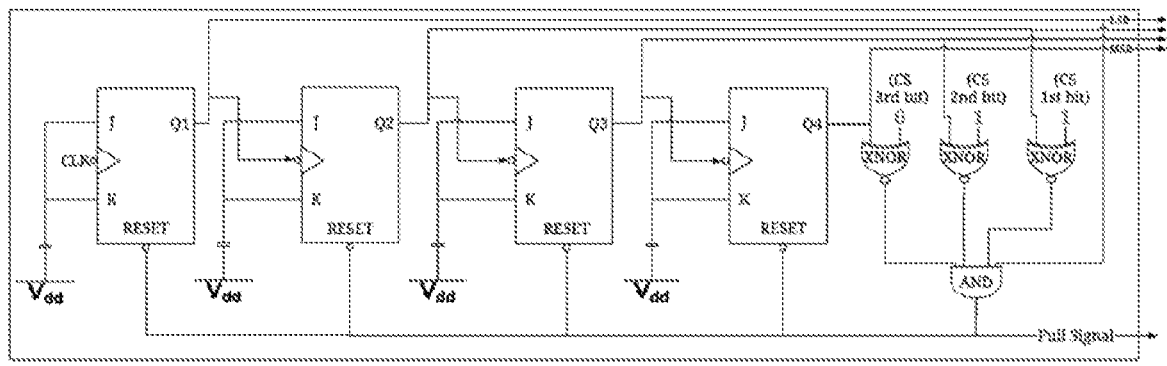
FIG. 5 provides the logic diagram of a 4-bit modified counter.
Figure 7:
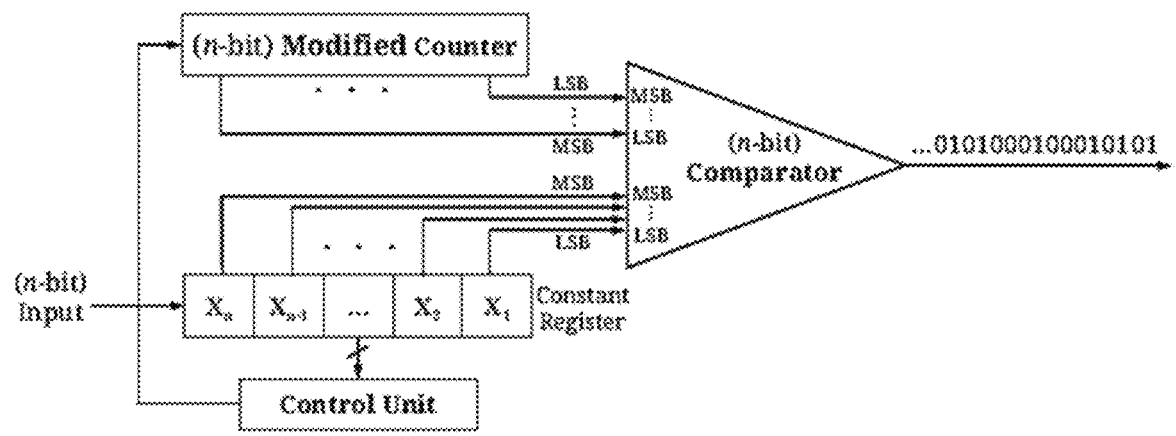
FIG. 7 is a diagram of the disclosed bit-stream generator with Control Unit (CU) and Modified Counter (MC).
Figure 8:
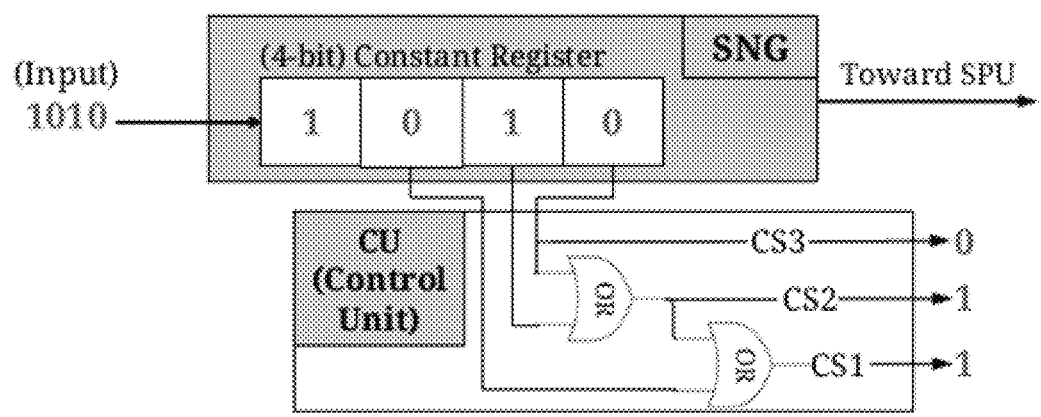
FIG. 8 provides a diagram of a 4-bit CU generating control signals for input value=10/16.
Figure 9:
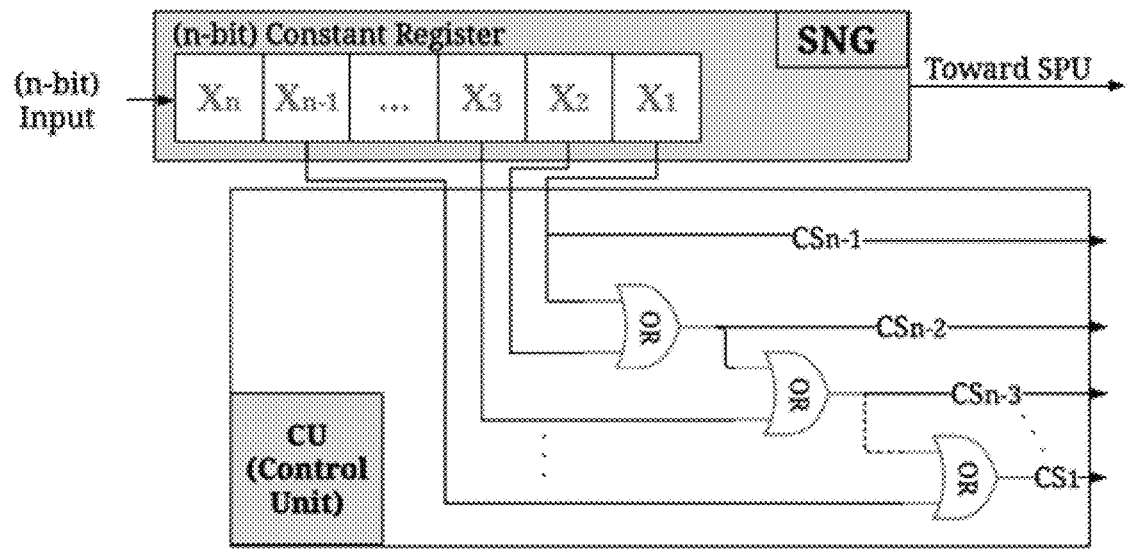
FIG. 9 provides a diagram of the n-bit CU.

FIG. 7 depicts the disclosed context-aware bit-stream generator for the clock division and rotation-based designs. The generator comprises a modified counter (MC) as well as a control unit (CU) for determining the data-width. The CU reads the input data from the constant register and determines the minimum data-width necessary to precisely represent the input data. FIG. 8 shows how CU produces the control signal for A=10/16 (1010 in binary radix). 10/16 is equivalent to 5/8 and therefore has a data-width of 3 bits. CU sends 011 to the MC, forcing it to work as a 3-bit counter (counting from 0 to 7) instead of a 4-bit counter. FIG. 5 shows the structure of a 4-bit MC. The output bits of the MC are connected to the comparator in reverse order. Considering the fact that the simplest Sobol sequence can be generated by simply reversing the output bits of a counter, by connecting the output bits of the MC to the comparator in reverse order the effective bits of the constant register (e.g., 101 in 1010 and 1 in 1000) is compared to a new Sobol number in each cycle. This results in converting the input binary data to a fast converging LD bit-stream, instead of a unary bit-stream (by comparing to the output bits of a counter in normal order), at no additional hardware cost. LD bit-streams are preferred to unary bit-streams as they enjoy the progressive precision of random bit-streams. FIG. 9 shows the general structure of the n-bit CU for the disclosed bit-stream generator.

Figure 10:
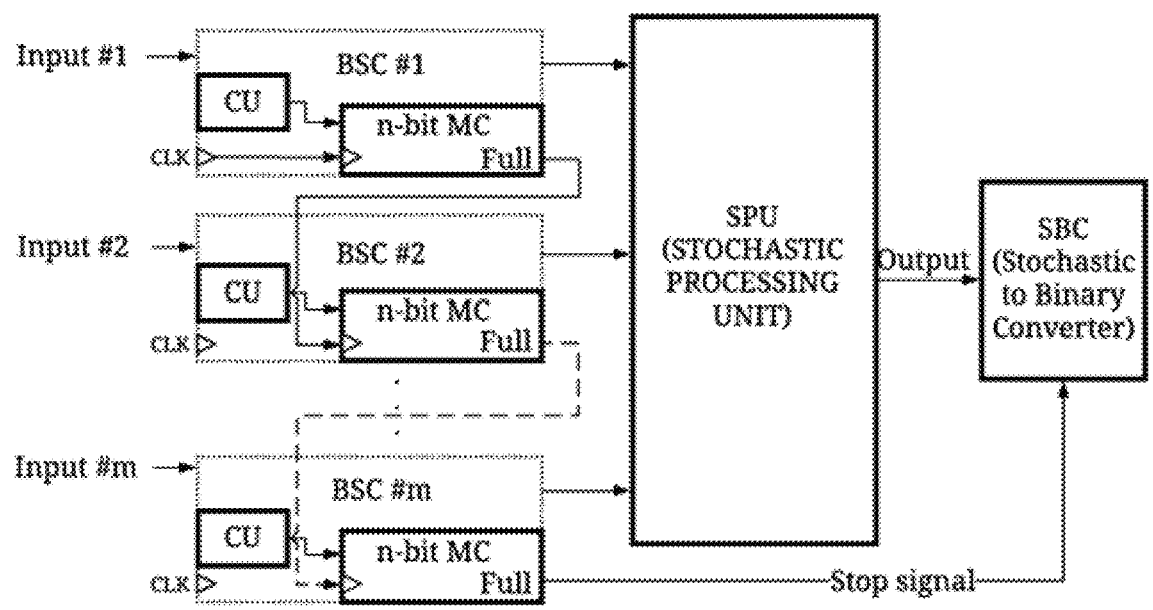
FIG. 10 is an embodiment of the context-aware architecture for a "clock-division"-based deterministic bit-stream processing system.
Figure 11:
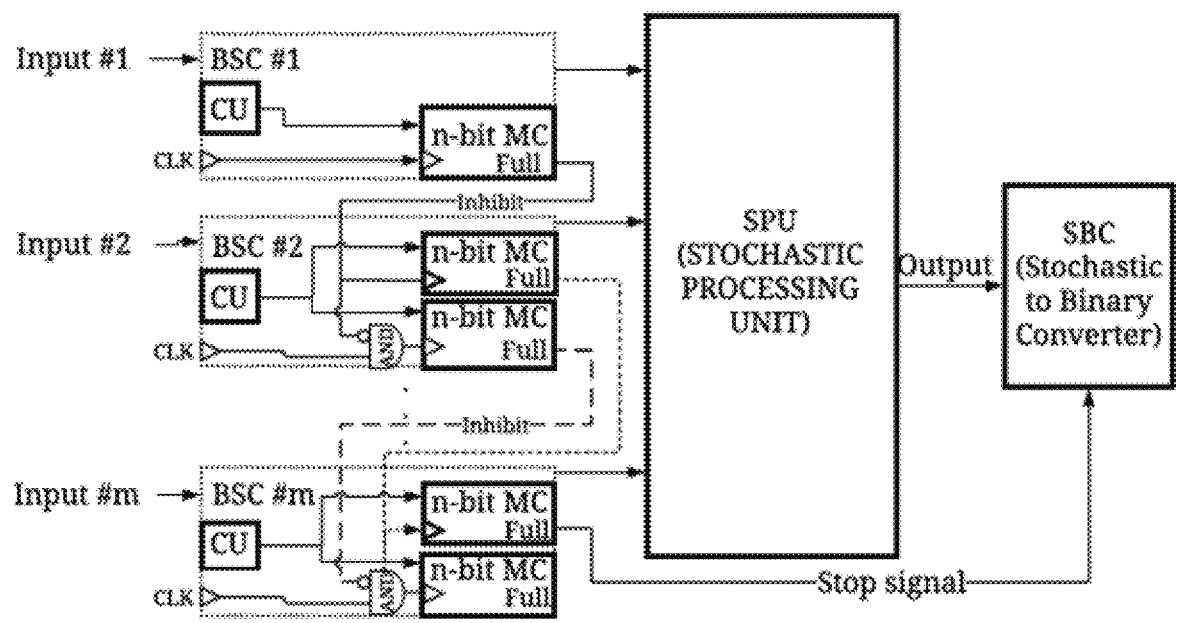
FIG. 11 is an embodiment of the context-aware architecture for a "rotation"-based deterministic bit-stream processing system.

FIG. 10 depicts our proposed context-aware architecture for a "clock division"-based deterministic bit-stream processing system. The system operates for $2^{Q_1+Q_2+\cdots+Q_m}$ cycles (instead of $2^{m \times n}$ cycles), where $Q_i$ is the data-width of input i and m is the number of independent inputs in the system. The conventional architecture of a "rotation"-based system uses some regular counters to inhibit the converters at the powers of the operands (i.e., bit-streams) lengths. FIG. 11 shows our proposed context-aware architecture for a "rotation"-based system. The proposed design similarly replaces the regular counters with MC units. The inhibit and stop signals are generated depending on the bit-width determined by the CU units.

Figure 12:
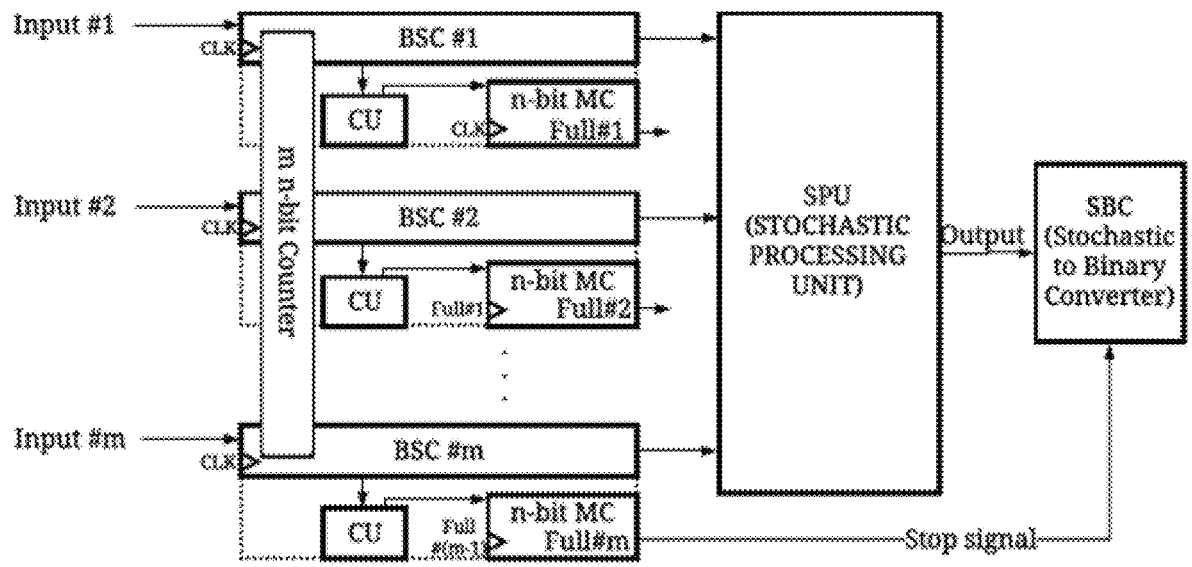
FIG. 12 is an embodiment of the context-aware architecture for a "Sobol"-based deterministic bit-stream processing system.
Figure 13A:
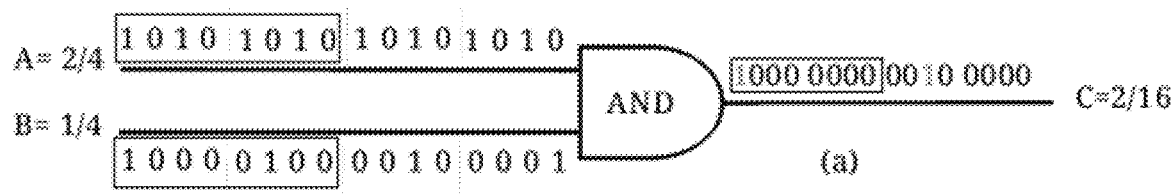
FIG. 13(a) provides an example of Sobol bit-stream-based multiplication known in the art.
Figure 13B:
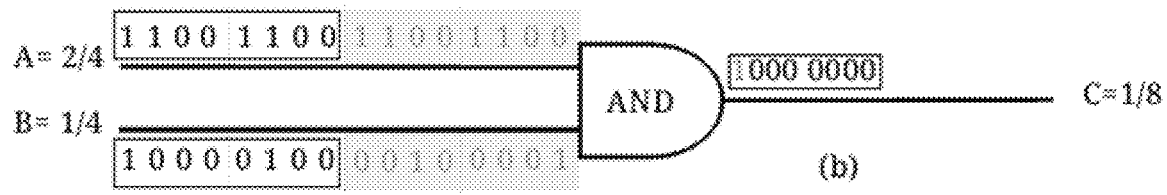
FIG. 13(b) provides an example of an embodiment of Sobol bit-stream-based multiplication as applied to the disclosed architecture.

A context-aware architecture for the Sobol-based deterministic design is shown in FIG. 6. The first $2^n$ bits of a Sobol-based bit-stream can precisely represent an n-bit precision data. Due to this property of Sobol-based bit-streams no change in the structure of the converter modules is necessary to adapt the system to the input data. Only the stop signal must be set accordingly. FIG. 12 presents our proposed architecture. CU receives the input data from the constant register and sends some control signals to the MC unit. FIG. 13 demonstrates an example of deterministic bit-stream multiplication using the conventional and the proposed design. As can be seen, shorter bit-streams are generated and processed with the proposed design by cutting the operation at the point needed to get the accurate result.

Figure 14:
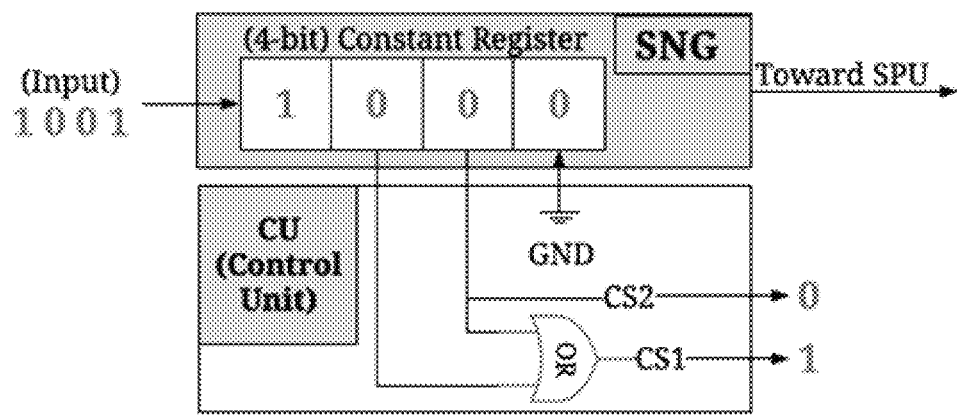
FIG. 14 is an embodiment of the 4-bit control unit for error tolerant applications.

In binary radix representation, least significant bits (LSBs) have less impact on the accuracy of computations than most significant bits (MSBs). This impact further reduces when the bit-width of data increases. The difference between two 8-bit precision numbers A=10000000 and B=10000001 is only on the LSB. A represents 0.5 while B represents 0.5039. The absolute difference between these two values is only 0.0039, a negligible difference for many applications. If the application can tolerate such small rates of inaccuracy, it is feasible to further reduce the processing time of deterministic bit-stream processing for many input cases. For example, if setting the LSB of B=10000001 to 0, the input data can be precisely represented using a stream of only 2 bits rather than a stream of $2^8$ bits. This will significantly reduce the number of processing cycles at the cost of a negligible accuracy loss. FIG. 14 shows a modified CU for a system that processes 4-bit precision inputs and can tolerate small rates of inaccuracy. Assume two 4-bit inputs, A=1001 and B=1001, are to be multiplied. With the proposed design, the number of clock cycles decreases from $2^8$ to $2^2$ at the cost of 0.06 absolute error rate. This rate of error further decreases as the bit-width increases.

As shown in FIG. 9, CUs include some standard OR gates. MCs also contain some additional XNOR gates compared to the regular counters. The overhead cost of these units is insignificant compared to the total cost of the system. FIG. 15 shows the overhead of the proposed designs for different input data-widths in terms of the required additional logic gates. For example, for the 16-bit precision design 14 additional OR and 15 additional XNOR gates are required for the clock division- and the Sobol-based systems, and 30 additional XNOR gates are required for the rotation-based system.

By accepting some inaccuracies in the computation, not only the overhead but also the overall area occupancy of the system decreases compared to the conventional architecture. This additional saving is due to further reduction in the size of the MC units. For example, assume the data bit-width is 16 and the application can tolerate up to 2 percent error rate in the result. This allows the system to ignore up to 6 LSBs (set them to 0) for a 2-input multiplier design. The modified design for such an error-tolerant application has an overhead of 8 OR and 9 XNOR gates (for the clock division and Sobol-based designs) and can work with a 10-bit counter instead of a 16-bit one. For some rates of error, the hardware savings from reducing the size of the counter will be higher than the overhead cost of additional gates added to the system. Hence, in some cases the proposed designs can reduce the hardware cost compared to the conventional architecture.

The conventional BSC unit (shown in FIG. 2) and the disclosed bit-stream generator (shown in FIG. 7) were synthesized using the Synopsis Design Compiler v2018.06 with the 45 nm FreePDK gate library. For the conventional BSC unit the regular binary counter is used as the number generator. FIG. 16 compares the hardware area cost and the critical path latency (CP) for three different input precisions. As shown, the bit-stream generator costs up to 27 percent area overhead with the same CP latency. A significant decrease in the number of processing cycles compared to the conventional BSC leads to a considerable reduction in the total latency (CP×number of processing cycles) and hence in the energy consumption.

Figure 19:
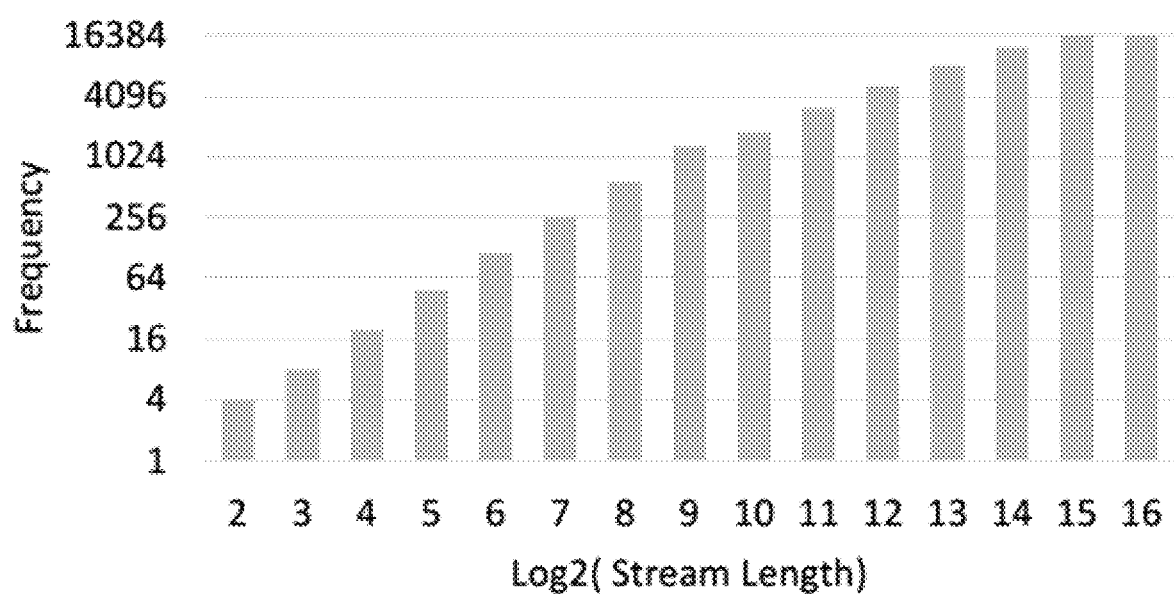
FIG. 19 provides a histogram distribution of the resulting bit stream lengths for an experimental case of processing two 8-bit precision data using the proposed context-aware designs.

FIG. 17 reports the performance improvements with the disclosed designs. For each case (i.e., different number of inputs and different data precision) the number of processing cycles required for the conventional design and also the percentage of the reduced number of cycles with the proposed design when exhaustively processing all possible input cases (e.g., 256×256 combinations for the case of processing two 8-bit precision input data) is reported. As shown, by increasing the number of inputs and the precision of data a higher reduction in the number of processing cycles is achieved. FIG. 19 shows the histogram distribution of the resulting bit-stream lengths for the case of processing two 8-bit precision data using the proposed context aware designs.

FIG. 18 and FIG. 20 demonstrate the performance of the proposed context-aware architectures for error-tolerant applications. All the three proposed designs achieve a significant reduction in the processing time when accepting some small rates of error in the computation. For example, for the case of multiplying two 16-bit precision inputs for an application with error tolerance of 0.20 percent, the proposed clock division and rotation designs achieve $3.3 \times 10^4$ times reduction in the number of processing cycles and the proposed Sobol-based design is capable of decreasing the processing cycles by $6.6 \times 10^4$ times on average compared to the conventional design with a processing time of $2^{32}$ clock cycles.

Figures 21, 22:
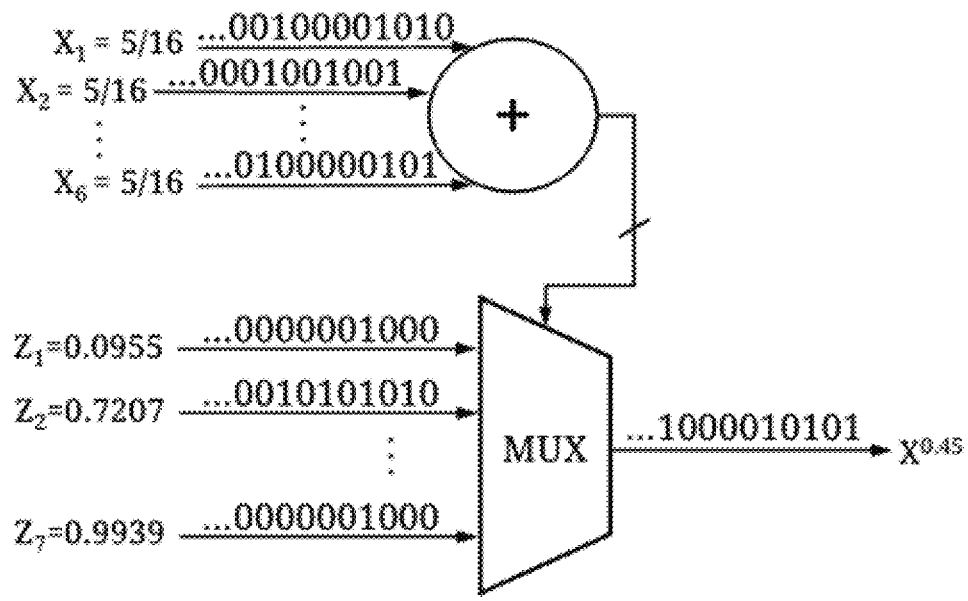
FIG. 21 is a diagram of a Gamma Correction Stochastic Circuit.
FIG. 22 provides a table of the energy consumption of the Gamma Correction Stochastic Circuit.

To further evaluate the performance of the proposed design, the ReSC architecture-based Gamma Correction circuit was implemented. FIG. 21 shows the implemented architecture. This circuit approximates the gamma correction function ($F(x)=X^{0.45}$) by mapping the function into a degree-6 Bernstein polynomial. Six independent bit-streams, all representing the same input value of X, must be generated and summed to select one input of the multiplexer (MUX) in each cycle. The inputs of the MUX are seven correlated bit-streams corresponding to the Bernstein Coefficients of the Gamma Correction function, namely, $b0=0.0955$, $b1=0.7207$, $b2=0.3476$, $b3=0.9988$, $b4=0.7017$, $b5=0.9695$, and $b6=0.9939$. Correlated bit-streams can be generated by sharing the same number source among the bit-stream generators. Energy consumption of the Gamma Correction circuit with the proposed and with the conventional bit-stream generator are reported in FIG. 22. The energy for processing of four 512×512 input test images is reported. Each pixel of each input test image is converted to six independent bit-streams (i.e., X1-X6) using the bit-stream generator and processed by the Gamma Correction stochastic circuit. As shown, the proposed context-aware design reduces the energy consumption more than 2x.

The subject matter of the present invention has been disclosed as being intended for use in computing; however, those having skill in the art may recognize the applicability of the designs and methods to other industries. Nothing in this disclosure is intended to limit the design to one industry or technology.

The subject matter of the present invention is described with specificity herein to meet statutory requirements. However, the description itself is not intended to necessarily limit the scope of claims. Rather, the claimed subject matter might be embodied in other ways to include different steps or combinations of steps similar to the ones described in this document, in conjunction with other present or future technologies.

Modifications, additions, or omission may be made to the systems, apparatuses and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to a member of a set or each member of a subset of a set.

Furthermore, the described features, structures, or characteristics may be combined in any suitable manner in one or more embodiments. Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment.

Moreover, the terms "substantially" or "approximately" as used herein may be applied to modify any quantitative representation that could permissibly vary without resulting in a change to the basic function to which it is related.

We claim:

1. A method for processing input data in a deterministic bit-stream processing computing system, comprising:
   (a) providing two or more context-aware bit-stream generators, comprising:
   a modified counter, comprising an n-bit input;
   a control unit;
   a constant register;
   a comparator;
   wherein two or more output bits of the modified counter are connected to the comparator in reverse order;
   (b) for each context-aware bit-stream generator:
      (i) receiving n-bit input data by the constant register;
      (ii) the control unit reads the n-bit input data in the constant register;
      (iii) the control unit determines a minimum data width for representing the n-bit input data;
      (iv) sending the minimum data width determined by the control unit to the modified counter;
      (v) sending the two or more output bits of the modified counter to the comparator in reverse order;
      (vi) comparing the two or more output bits of the modified counter to the n-bit input data of the constant register; and
      (vii) generating a low-discrepancy bit stream;
   (c) inputting each low-discrepancy bit stream to a stochastic processing unit;
   (d) converting an output of the stochastic processing unit to binary by a stochastic to binary converter.

2. The method of claim 1, wherein the modified counter further comprises:

two or more JK flip flop gates;
two or more XNOR gates; and
an AND gate;
wherein outputs of the two or more JK flip flop gates provide inputs for the two or more XNOR gates; and
wherein outputs of the two or more XNOR gates provide inputs for the AND gate.

3. The method of claim 1, wherein the control unit comprises:
a stochastic number generator (SNG);
two or more OR gates; and
the constant register.

4. The method of claim 1, further comprising, for each context-aware bit-stream generator, an output of the modified counter provides an input to the modified counter of a next sequential context-aware bit-stream generator.

5. The method of claim 1, further comprising sending a stop signal to the stochastic to binary converter by a last in sequence context-aware bit-stream generator.

6. The method of claim 1, wherein each context-aware bit-stream generator except for a first in sequence context-aware bit-stream generator further comprises an additional modified counter and an AND gate.

7. The method of claim 1, wherein each context-aware bit-stream generator except for a first in sequence context-aware bit-stream generator further comprises an additional modified counter and an AND gate; and wherein each modified counter provides an inhibit signal to a next sequential context-aware bit-stream generator's modified counter and additional modified counter.

8. A computing architecture for deterministic bit-stream processing, comprising:
two or more binary-to-stochastic converters (BSCs);
wherein each BSC comprises:
an input;
an output;
a clock signal;
a context-aware bit-stream generator, comprising:
a constant register configured to receive n-bit input data;
a control unit configured to read the n-bit input data in the constant register and determine a minimum data width for representing the n-bit input data;
a modified counter configured to receive the minimum data width determined by the control unit;
a comparator configured to receive output bits of the modified counter in reverse order and compare the output bits of the modified counter to the n-bit input data of the constant register to generate a low discrepancy bit stream;
a stop signal;
a stochastic processing unit; and
a stochastic to binary converter;
wherein the output of each BSC provides an input to the stochastic processing unit; and
the output of the stochastic processing unit provides an input to the stochastic to binary converter.

9. The computing architecture of claim 8, wherein each modified counter provides an input to a next sequential BSC's the modified counter.

10. The computing architecture of claim 8, wherein each BSC except for a first sequential BSC comprise an additional modified counter.

11. The computing architecture of claim 8, wherein each BSC except for a first sequential BSC comprise an additional modified counter and an AND gate; and
wherein each modified counter provides an inhibit signal to a next sequential BSC's modified counter and additional modified counter.

12. The computing architecture of claim 8, wherein each BSC except for a first sequential BSC comprise an additional modified counter and an AND gate; and wherein one input of the AND gate comprises a NOT function.

13. The computing architecture of claim 8, further comprising a counter that is shared by all BSCs.

* * * * *